United States Patent
Kim et al.

(10) Patent No.: US 7,456,434 B2
(45) Date of Patent: Nov. 25, 2008

(54) MICRO OPTICAL BENCH STRUCTURE

(75) Inventors: Yong-sung Kim, Seoul (KR);
Seok-whan Chung, Suwon-si (KR);
Jao-ho You, Seoul (KR); Hyung Choi,
Seongnam-si (KR); Woong-lin Hwang,
Gunpo-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 0 days.

(21) Appl. No.: 11/033,720

(22) Filed: Jan. 13, 2005

(65) Prior Publication Data

US 2005/0169570 A1   Aug. 4, 2005

(30) Foreign Application Priority Data

Jan. 13, 2004   (KR) .............. 10-2004-0002251

(51) Int. Cl.
*H01L 27/15* (2006.01)
(52) U.S. Cl. .............. 257/82; 257/81; 257/80; 257/79; 257/E33.061; 438/22; 438/24
(58) Field of Classification Search ......... 257/80–82, 257/79, 98–99, 433–432; 438/22–24
See application file for complete search history.

(56) References Cited

U.S. PATENT DOCUMENTS 6,137,121 A * 10/2000 Yamamoto et al. .......... 257/80

| | | |
|---|---|---|
| 2002/0136256 A1 | 9/2002 | Hamasaki et al. |
| 2003/0016448 A1 | 1/2003 | Takasuka et al. |
| 2003/0053498 A1* | 3/2003 | Hamasaki et al. ....... 372/36 |
| 2003/0189819 A1* | 10/2003 | Furuya ................. 362/26 |
| 2004/0170110 A1* | 9/2004 | Yee ..................... 369/121 |

FOREIGN PATENT DOCUMENTS

| JP | 09 191154 A | 7/1997 |
|---|---|---|
| JP | 11 233875 A | 8/1999 |
| JP | 2002/141595 A | 5/2002 |

OTHER PUBLICATIONS

H. Ishiguro et al., "A Laser-Detector-Hologram Unit With IV Amplifiers and Built-In Micro-Mirror", IEEE International Solid State Circuits Conference, IEEE Service, New York, NY, US, vol. 39, Feb. 1996, pp. 330-331, 468, XP000685647, ISSN: 0193-6530, figure 1.

* cited by examiner

*Primary Examiner*—Dung A. Le
(74) *Attorney, Agent, or Firm*—Sughrue Mion, PLLC

(57) ABSTRACT

A micro optical bench structure and a method of manufacturing a micro optical bench structure are provided. The micro optical bench structure includes: a lower substrate; an upper substrate which is bonded to the lower substrate, and has a through-hole for exposing the lower substrate; and a first optical device which is installed at the lower substrate, and units relating to the first optical device.

15 Claims, 5 Drawing Sheets

MICRO OPTICAL BENCH STRUCTURE

BACKGROUND OF THE INVENTION

This application claims the priority of Korean Patent Application No. 10-2004-0002251, filed on Jan. 13, 2004, in the Korean Intellectual Property Office, the disclosure of which is incorporated herein in its entirety by reference.

1. Field of the Invention

The present invention relates to an optical pickup device and a method of manufacturing the same and, more particularly, to a micro optical bench structure having a light emitting device such as a laser diode and a light receiving device such as a photo diode and a method of manufacturing the same.

2. Description of the Related Art

When information is written on a disc-type optical recording medium such as Compact Disks (CDs) or Digital Versatile Disks (DVDs), an inputted electric signal is converted into a laser beam and irradiated on the optical recording medium. Additionally, when information recorded in the optical recording medium is read, the laser beam, which is reflected from the optical recording medium, is detected and converted into the electric signal.

An optical pickup device is used as a main part for recording and reproducing information as described above. The optical pickup device includes a laser diode, a photo diode, an optical bench and the like. Light emitting and receiving devices such as the laser diode and the photo diode are installed at the optical bench. Accordingly, the optical bench may have a critical influence on miniaturization, low price and yield of the optical pickup device.

FIG. 1 is a sectional view illustrating a conventional micro optical bench structure.

Referring to FIG. 1, a groove 12 is provided in a silicon substrate 10, which is sawed at 9.74 degrees, such that a laser diode 22 is installed at the groove 12. The bottom 12a of the groove 12 is convex-shaped. A first electrode wire 18a is installed on the bottom 12a of the groove 12, and a solder bump 20 is installed on the first electrode wire 18a. The laser diode 22 is installed on the solder bump 20. The side surface 12b around the bottom 12a of the groove 12 is sloped. A mirror 24 is installed on the side surface 12b of the groove 12. The mirror 24 faces with a laser beam emission surface of the laser diode 22. The mirror 24 upwardly reflects laser beam L emitted from the laser diode 22. A photo diode 16 is mounted on the silicon substrate 10 around the groove 12. A second electrode wire 18b is installed on the silicon substrate 10 around the photo diode 16. The first and second electrode wires 18a and 18b are connected with each other, and the second electrode wire 18b is connected to an external power supply (not shown). The external power is supplied to the laser diode 22 through the second electrode wire 18b and the first electrode wire 18a, and the laser diode 22 emits the laser beam L.

The conventional optical bench structure has a drawback in that some product characteristics, for example, reproducibility can be reduced due to a complicated process.

SUMMARY OF THE INVENTION

Illustrative, non-limiting embodiments of the present invention overcome the above disadvantages and other disadvantages not described above. Also, the present invention is not required to overcome the disadvantages described above, and an illustrative, non-limiting embodiment of the present invention may not overcome any of the problems described above.

The present invention provides a micro optical bench structure in which process can be simplified, and reproducibility and reliability can be increased.

Also, the present invention provides a method of manufacturing a micro optical bench structure.

According to an aspect of the present invention, there is provided a micro optical bench structure including: a lower substrate; an upper substrate which is bonded to the lower substrate, and has a through-hole for exposing the lower substrate; and a first optical device which is installed at the lower substrate, and units relating to the first optical unit.

The first optical device may be installed on the lower substrate within the through-hole. The units may be an electrode wire that is provided between the first optical device and the lower substrate to extend between the upper substrate and the lower substrate, and a flip-chip bonding unit provided between the first optical device and the electrode wire. Further, the first optical device may be a light emitting device, and the lower substrate may be a glass substrate.

The inner surface of the through-hole, which faces with the first optical device, may be sloped at 45 degrees.

The upper substrate can include a second optical device including a reflection unit disposed on the sloped surface, and a light receiving device disposed on the upper substrate in a vicinity of the through-hole. The light receiving device may be buried in the upper substrate.

The upper substrate may be a semiconductor substrate that is sawed at a predetermined angle.

According to another aspect of the present invention, there is provided a method of manufacturing a micro optical bench structure, the method including: sequentially installing an electrode wire and a flip-chip bonding unit to a first substrate; mounting a light receiving device on a second substrate; forming a through-hole in the second substrate having the light receiving device; installing a reflection unit on an inner surface of the through-hole; bonding the first and second substrates to each other such that the flip-chip bonding unit is positioned at the inside of the through-hole; and bonding a light emitting device to the flip-chip bonding unit.

At this time, the installing of the electrode wire and the flip-chip bonding unit can include: forming a conductive layer, which is used as the electrode wire, on the first substrate; forming a flip-chip bonding unit on the conductive layer; and patterning the conductive layer. Additionally, an adhesive layer and a main wire layer may be sequentially layered to form the conductive layer.

The forming of the flip-chip bonding unit on the conductive layer may further include: forming a mold layer on the conductive layer; forming a through-hole, which exposes the conductive layer, in the mold layer; filling the through-hole with the flip-chip bonding unit; and removing the mold layer.

The forming of the through-hole may further include: forming an etching stopper layer on a bottom surface of the second substrate; forming a mask layer on a top surface of the second substrate to cover the light receiving device; patterning the mask layer to expose the second substrate around the light receiving device; etching an exposed portion of the second substrate until the etching stopper layer is exposed; and removing the etching stopper layer and the mask layer.

In the etching of the exposed portion of the second substrate, an inner surface of the second substrate may be sloped at 45 degrees.

The installing of the reflection unit may further include: forming a mask over the second substrate having the through-hole to expose a portion of the inner surface of the through-hole, the reflection unit is to be installed on the portion; and depositing material with high reflectance on the exposed portion of the inner surface of the through-hole to a uniform thickness.

The light receiving device is installed in a burial type, and the first substrate can be a glass substrate.

The sequential forming of the electrode wire and the flip-chip bonding unit may further include: forming a conductive layer, which is used as the electrode wire, on the first substrate; patterning the conductive layer in a predetermined shape; and forming the flip-chip bonding unit on the patterned conductive layer.

At this time, the forming of the flip-chip bonding unit on the patterned conductive layer may further include: forming a mold layer on the patterned conductive layer; forming a through-hole in the mold layer to expose the patterned conductive layer; filling the through-hole with the flip-chip bonding unit; and removing the mold layer.

According to still another aspect of the present invention, there is provided a method of manufacturing a micro optical bench structure, the method including: sequentially forming an electrode wire and a flip-chip bonding unit at a first substrate; bonding a light emitting device to the flip-chip bonding unit; mounting a light receiving device on a second substrate; forming a through-hole in the second substrate; installing a reflection unit on an inner surface of the through-hole; and bonding the first and second substrates such that the light emitting device is positioned within the through-hole.

At this time, the forming of the electrode wire and the flip-chip bonding unit may be formed using the above-described cases, and the forming of the flip-chip bonding unit may be also formed using the same cases.

The forming of the through-hole may further include: forming an etching stopper layer on a bottom surface of the second substrate; forming a mask layer on a top surface of the second substrate to cover the light receiving device; patterning the mask layer to expose the second substrate around the light receiving device; etching an exposed portion of the second substrate until the etching stopper layer is exposed; and removing the etching stopper layer and the mask layer.

The installing of the reflection unit may further include: forming a mask over the second substrate to expose only a portion of the inner surface of the through-hole, the reflection unit is to be formed on the portion; and depositing material with high reflectance on the exposed portion of the inner surface of the through-hole to a uniform thickness.

According to the present invention, the number of steps in a manufacture process can be reduced, and the reproducibility and reliability can be enhanced due to a simple manufacture process and clear definition and verified reliability, and a production cost can be reduced while yield and productivity can be increased.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF ILLUSTRATIVE, NON-LIMITING EMBODIMENTS OF THE INVENTION

Figure 1:
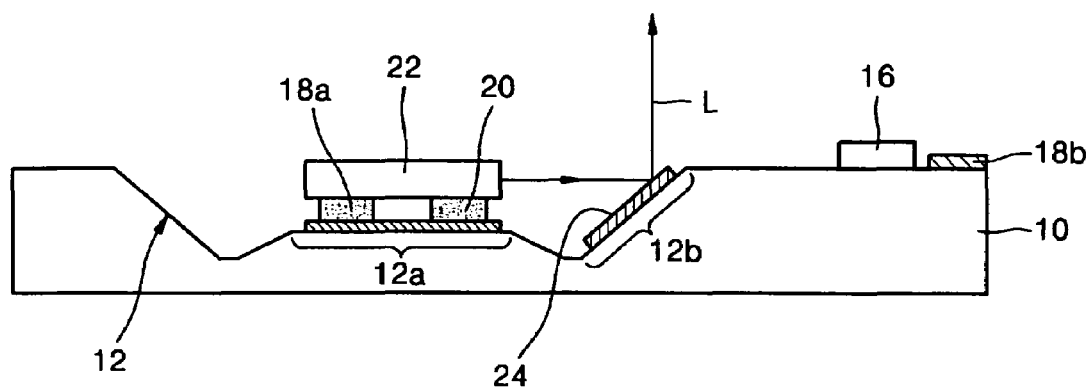
FIG. 1 is a sectional view illustrating a conventional micro optical bench structure.

The present invention will now be described more fully with reference to the accompanying drawings, in which exemplary embodiments of the invention are shown. The invention may, however, be embodied in many different forms and should not be construed as being limited to the exemplary embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their description will be omitted.

Consistent with the present invention, a micro optical bench structure and a method of manufacturing the same are simplified by anodic-bonding a silicon substrate to a glass substrate unlike a conventional method of manufacturing devices on a silicon substrate.

First, the micro optical bench structure according to an exemplary embodiment of the present invention (hereinafter, referred to as "inventive structure") is described as follows.

Figure 2:
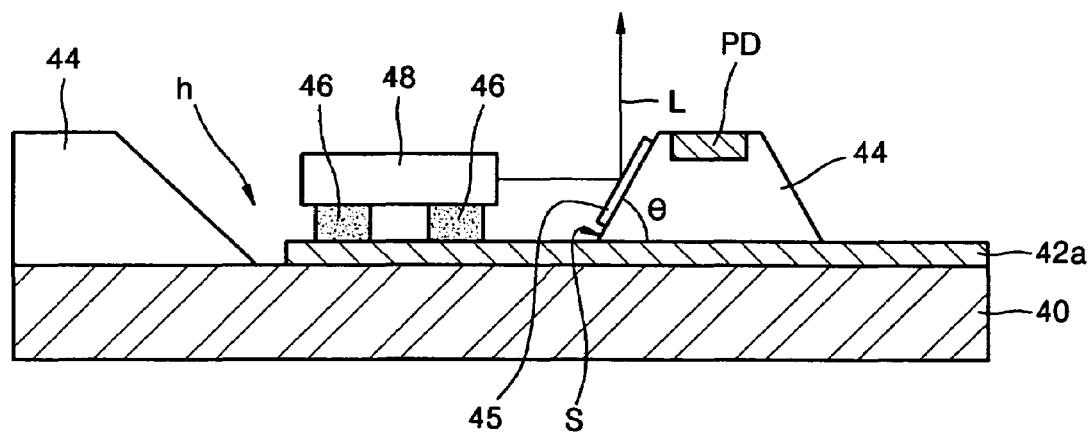
FIG. 2 is a sectional view illustrating a micro optical bench structure according to an exemplary embodiment of the present invention.

FIG. 2 is a sectional view illustrating the micro optical bench structure according to an exemplary embodiment of the present invention.

Referring to FIG. 2, an electrode wire 42a is formed on a predetermined region of a glass substrate 40. The electrode wire 42a can be a multi-layered wire having an adhesive layer. Also, the electrode wire 42a can be a single-layered wire when the electrode wire 42a has excellent adhesive force and conductivity. When the electrode wire 42a is the multi-layered wire, the electrode wire 42a may be comprised of the adhesive layer and a main wire layer. At this time, the adhesive layer may be a chromium (Cr) layer, and the main wire layer may be a gold (Au) layer. Together with the electrode wire 42a, a semiconductor substrate 44, for example, a silicon substrate is provided on the glass substrate 40. The silicon substrate is sawed at 9.74 degrees. A portion of the semiconductor substrate 44 is provided on the electrode wire 42a. A through-hole (h) is provided at the semiconductor substrate 44 to expose the electrode wire 42a and the glass substrate 40. A light emitting device 48, for example, a laser diode is disposed on a portion of the electrode wire 42a which is exposed through the through-hole (h). The light emitting device 48 is installed at the electrode wire 42a through a flip-chip bonding unit 46. The flip-chip bonding unit 46 may be a solder bump with a multi-layer structure having a gold (Au) layer and a tin (Sn) layer, for example. In this case, the tin layer functions to increase the adhesive force between the light emitting device 48 and the gold layer of the flip-chip bonding unit 46. The flip-chip bonding unit 46 may be single-layered if it has large adhesive force and conductivity with respect to the light emitting device 48. The surface (S) of the semiconductor substrate 44, which faces with the light emitting device 48, is sloped by a predetermined angle θ with respect to the electrode wire 42a. At this time, the angle θ may be about 45 degrees. A reflection unit 45 is provided on the surface (S) of the semiconductor substrate 44. The reflection unit 45 reflects laser beam L emitted from the light emitting device 48 in an upward direction that is vertical to the glass substrate 40. The reflection unit 45 may be a mirror that is formed of material with high reflectance, for example, aluminum (Al). In case where the surface (S) of the semiconductor substrate 44, which directs toward the light emitting device 48, has high reflectance in itself, the reflection unit 45 may be omitted. A light receiving device (PD) is buried in the flat portion of the semiconductor substrate 44, which is formed on the electrode wire 42*a*. The light receiving device (PD) may be a photo diode. The light receiving device (PD) also may be disposed on the flat portion of the semiconductor substrate 44.

A method of manufacturing the inventive bench structure (hereinafter, referred to as "inventive method") is described with reference to FIGS. 3 through 12 as follows.

The inventive method may include: processing the semiconductor substrate to form units; forming units on the glass substrate; bonding the semiconductor substrate with the glass substrate; and mounting the light emitting device on the flip-chip bonding unit of the glass substrate.

Figure 3:
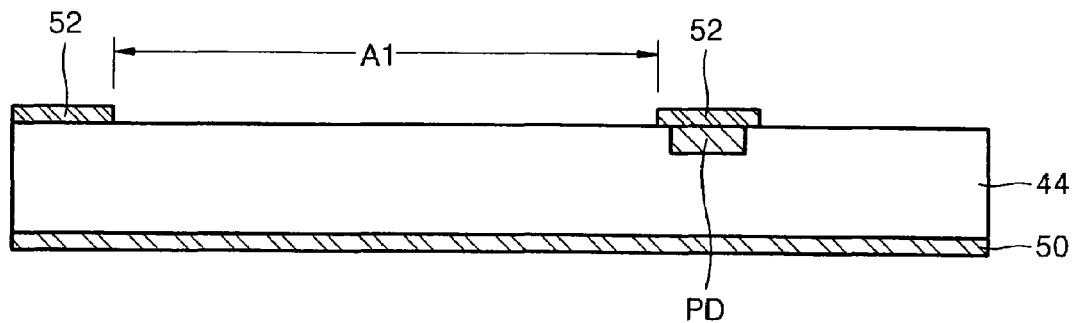
FIGS. 3 through 12 are sectional views illustrating a method of manufacturing a micro optical bench structure of FIG. 2.
Figure 4:
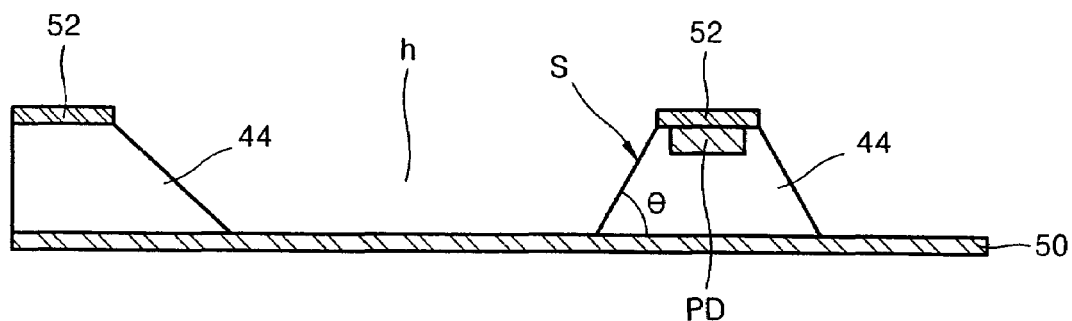
Figure 5:
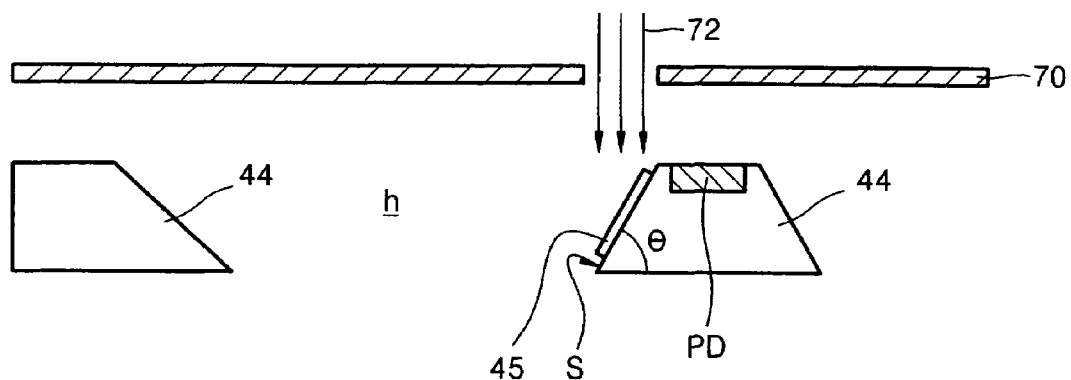
Figure 9:
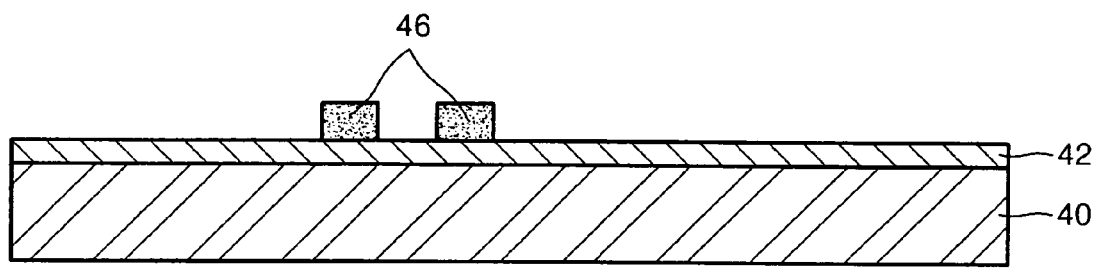
Figure 10:
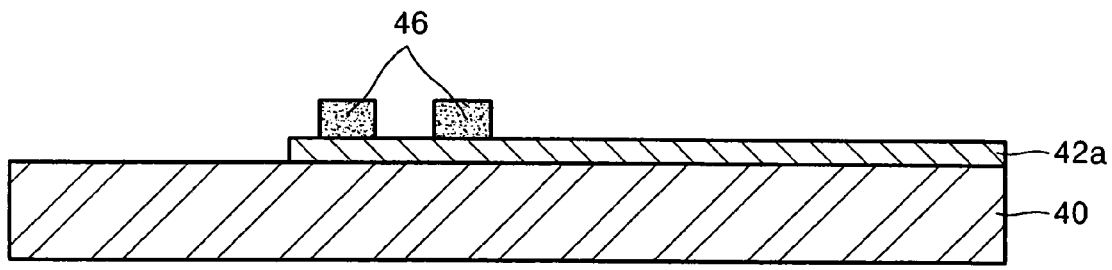
Figure 11:
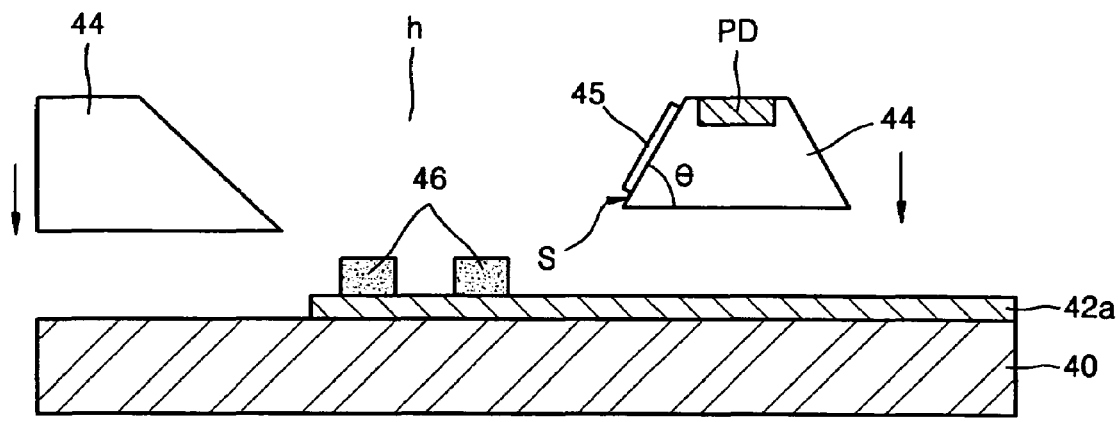
Figure 12:
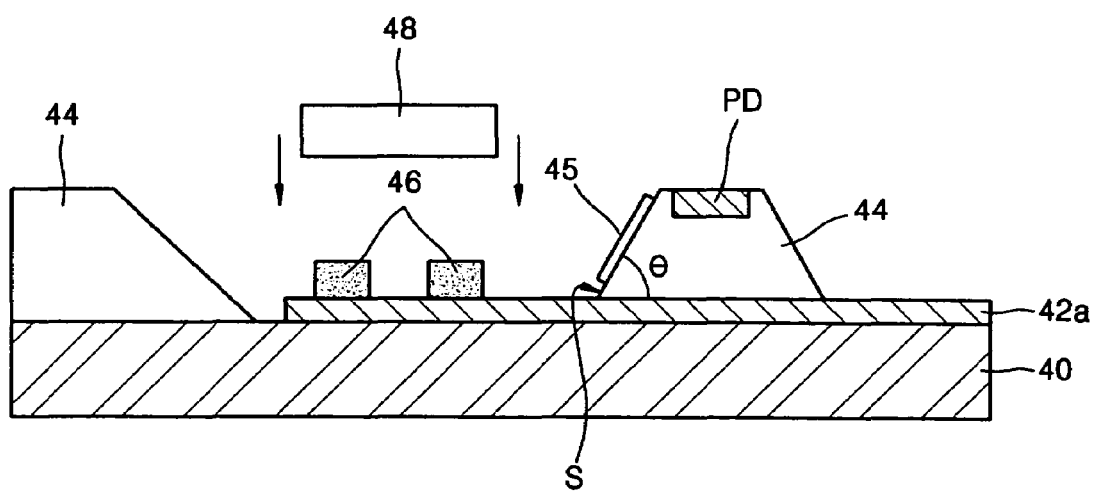

FIGS. 3 through 5 illustrate the processing of the semiconductor substrate, FIGS. 6 through 10 illustrate the forming of the units, FIG. 11 illustrates the bonding, and FIG. 12 illustrates the mounting of the light emitting device.

First, with reference to FIG. 3, the light receiving device (PD) is installed at the semiconductor substrate 44. The semiconductor substrate 44 may be formed with the silicon substrate, which is sawed at a predetermined angle, for example, at a slope angle of 9.74 degrees. The light receiving device (PD) may be a photo diode. An etching stopper layer 50 is formed on the bottom surface of the semiconductor substrate 44. A mask layer 52 is formed to expose the predetermined region Al of the semiconductor substrate 44 and cover a light receiving device (PD) on the top surface of the semiconductor substrate 44. The etching stopper layer 50 may be formed with a first insulating layer, for example, a $Si_3N_4$ layer, and the mask layer 52 may be formed with a second insulating layer, for example, a $Si_3N_4$ layer. As described above, the etching stopper layer 50 and the mask layer 52 may be formed with the same insulating layer, but it does not matter that they are formed with different insulating layers.

After the formation of the mask layer 52, the exposed portion of the semiconductor substrate 44 is etched. The etching may be performed until the etching stopper layer 50 is exposed. By the etching, a through-hole (h) is provided in the semiconductor substrate 44 to expose the etching stopper layer 50 as shown in FIG. 4. In a subsequent process, a reflection unit 45 is installed on the inner surface (S) of the through-hole (h), which is provided in the semiconductor substrate 44, to reflect the laser beam in an upright direction. Or, since the inner surface (S) itself can be used as a reflection surface for the laser beam, the semiconductor substrate 44 may be etched to have the inner surface of the through-hole (h) that is sloped at the predetermined angle θ, for example, at the 45 degrees. The etching may be a wet etching. At this time, etchant with a high selectivity for silicon (Si), for example, kalium hydroxide (KOH) solution, may be used.

After the semiconductor substrate 44 is etched to provide the through-hole (h), the etching stopper layer 50 and the mask layer 52 are removed from the semiconductor substrate 44 through clean and dry processes.

Next, referring to FIG. 5, a shadow mask 70 is aligned at a position spaced apart from the semiconductor substrate 44 not having the etching stopper layer 50 and the mask layer 52 upward. The shadow mask 70 is designed to expose only a part of the inner surface of the through-hole (h), which is provided in the semiconductor substrate 44. Material 72 with high reflectance, for example, aluminum (Al) is deposited on the semiconductor substrate 44 using the shadow mask 70. Since the remaining portion of the semiconductor substrate 44 excepting for the inner surface S of the through-hole (h) is shadowed by the shadow mask 70, the material 72 with the high reflectance is deposited only on the inner surface (S) of the through-hole (h), which is provided in the semiconductor substrate 44, to have a uniform thickness. By the deposition of the material 72, the reflection unit 45 is formed on the inner surface (S) of the through-hole (h), which is provided in the semiconductor substrate 44. The reflection unit 45 reflects the laser beam in the upright direction. After the formation of the reflection unit 45, the shadow mask 70 is removed. Since the reflection unit 45 is to receive and reflect the laser beam emitted from the light emitting device to be installed in a subsequent process, it is preferable, but not necessary, that the reflection unit 45 may be disposed to be at the same height as that of the laser beam emission surface of the light emitting device.

Next, the forming of the units on the glass substrate is described.

Figure 6:
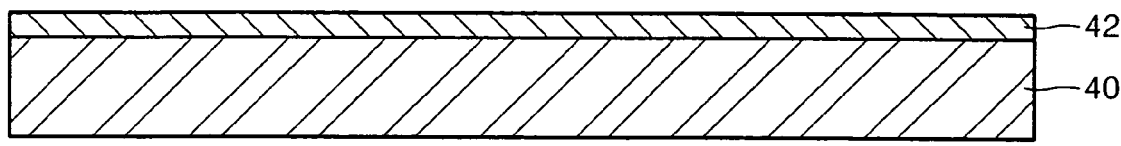

Referring to FIG. 6, a conductive layer 42 is formed on the glass substrate 40. An adhesive layer and a main wire layer may be sequentially layered to form the conductive layer 42. At this time, the adhesive layer may be formed with a chromium (Cr) layer, and the main wire layer may be formed with a gold (Au) layer.

As described above, the conductive layer 42 not only may be dual-layered, but also may be single-layered in case where the conductive layer 42 has the large adhesive force with the glass substrate 40 and the excellent conductivity.

Figure 7:
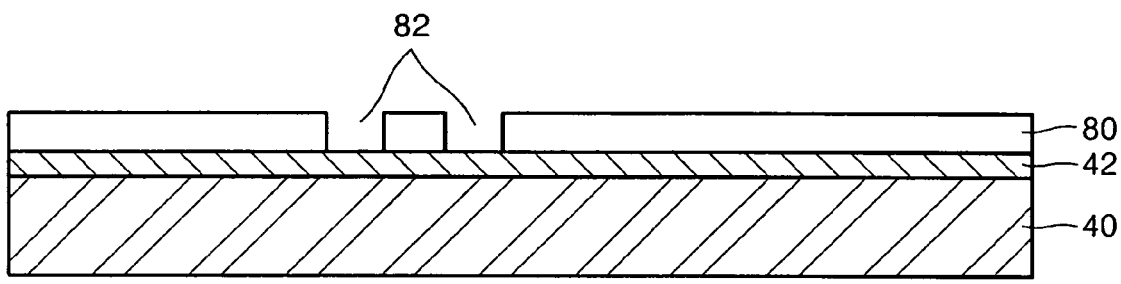

Next, as shown in FIG. 7, a mold layer 80 is formed on the glass substrate 40 to cover the conductive layer 42. After that, a through-hole 82 is formed in the mold layer 80 to form the flip-chip bonding unit. The mold layer 80 may be a photoresist layer, for example.

Figure 8:
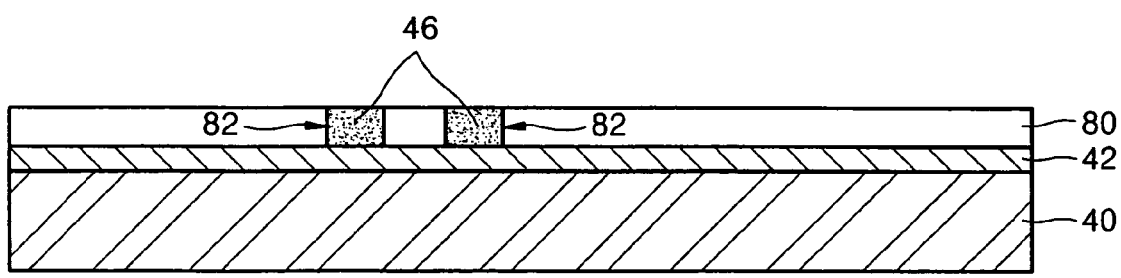

After that, as shown in FIG. 8, the through-hole 82 of the mold layer 80 is filled with a flip-chip bonding unit 46. The flip-chip bonding unit 46 may be a solder bump, for example, which is formed by sequentially layering a gold layer and a tin layer. In this case, the flip-chip bonding unit 46 not only may be formed using an electroplating, but also may be also formed using different methods. In case where material having an excellent conductivity and a large adhesive force to the light emitting device and the electrode wire is used, the flip-chip bonding unit 46 may be single-layered. In this case, the flip-chip bonding unit 46 may be formed using the electroplating or using the different methods noted above.

After the formation of the flip-chip bonding unit 46, the mold layer 80 is ashed and stripped for removal to complete the flip-chip bonding unit 46 on the conductive layer 42 as shown in FIG. 9.

Next, a photosensitive pattern (not shown) is formed to define the flip-chip bonding unit 46 and a portion around the flip-chip bonding unit 46 of the conductive layer 42, and expose the remaining portion of the conductive layer 42. The exposed portion of the conductive layer 42 is removed using the photosensitive pattern as an etching mask. After that, the photosensitive pattern is removed. As a result, as shown in FIG. 10, a conductive layer pattern on which the flip-chip bonding unit 46 is formed; that is, an electrode wire 42*a* is formed on the glass substrate 40. Additionally, a portion of the glass substrate 40 is exposed.

After the formation of the electrode wire 42*a*, the bonding process is performed.

In detail, as shown in FIG. 11, the semiconductor substrate 44, in which the through-hole (h) is formed and where the reflection unit 45 is installed on the surface S sloped at 45 degrees of the through-hole (h), is aligned over the glass substrate 40. At this time, the semiconductor substrate 44 may preferably, but not necessarily, be aligned such that the flip-chip bonding unit 46 is disposed within the through-hole (h) of the semiconductor substrate 44, and a portion of the semiconductor substrate 44 on which the light receiving device (PD) is installed is disposed over the electrode wire 42a, and the reflection unit 45 faces with the flip-chip bonding unit 46. The above-aligned semiconductor substrate 44 puts down, and is anodic-bonded in contact with the glass substrate 40 and the electrode wire 42a.

Next, as shown in FIG. 12, the light emitting device 48, for example, the laser diode is installed on the electrode wire 42a using the flip-chip bonding unit 46.

As described above, in the inventive micro optical bench structure and method of manufacturing the same, a photolithography which is very difficult is not required in a cavity structure having a large step coverage, and a drawback can be avoided in which the step coverage of the photoresist layer is degraded at the edge of the slope surface, and a manufacture process can be simplified because a developing process for a structure with a deep step coverage is not required. Further, because reliability of the above processes is generally verified, the present invention can enhance the reproducibility and reliability and can reduce a production cost while can increase yield and productivity. Further, since the present invention can omit the conventional very difficult processes, a manufacture process can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, before the mold layer 80 is formed, the conductive layer 42 can be patterned to form the electrode wire 42a. Further, the light receiving device (PD) can be installed on the semiconductor substrate 44, which is in contact with the glass substrate 40, not the electrode wire 42a. Further, the installing of the light emitting device can be performed earlier than the bonding. That is, before the semiconductor substrate 44 and the glass substrate 40 are bonded to each other, the light emitting device 48 can be installed on the flip-chip bonding unit 46.

Further, in case where the light receiving device (PD) is not buried and mounted on the predetermined region of the semiconductor substrate, the light receiving device (PD) can be installed before or after the mounting of the light emitting device 48.

Furthermore, the reflection unit 45 can be installed after the bonding. For example, the semiconductor substrate 42a and the glass substrate 40 are bonded to each other and then, the reflection unit 45 can be installed on the sloped surface (S) of the through-hole (h) before or after the installation of the light emitting unit 48 on the flip-chip bonding unit 46.

What is claimed is:

1. A micro optical bench structure comprising:
   a lower substrate;
   an upper substrate which is bonded to the lower substrate, and has a through-hole for exposing the lower substrate; and
   a first optical device which is installed at the lower substrate, and units relating to the first optical device; and
   wherein the units comprise an electrode wire that is provided between the first optical device and the lower substrate and extending between the upper substrate and the lower substrate.

2. The structure of claim 1, wherein the first optical device is installed on the lower substrate within the through-hole.

3. The structure of claim 2, wherein the units further comprise a flip-chip bonding unit provided between the first optical device and the electrode wire.

4. The structure of claim 3, wherein the electrode wire comprises an adhesive layer and a main wire layer that are sequentially layered.

5. The structure of claim 4, wherein the adhesive layer is a chromium (Cr) layer, and the main wire layer is a gold (Au) layer.

6. The structure of claim 3, wherein the flip-chip bonding unit is a solder bump.

7. The structure of claim 6, wherein the solder bump comprises a gold layer and a tin layer that are sequentially layered.

8. The structure of claim 1, wherein the first optical device comprises a light emitting device.

9. The structure of claim 1, wherein the lower substrate comprises a glass substrate.

10. The structure of claim 1, wherein an inner surface of the through-hole, which faces with the first optical device, is sloped at 45 degrees.

11. The structure of claim 10, wherein the upper substrate further includes a second optical device.

12. The structure of claim 11, wherein the second optical device includes a reflection unit disposed on the sloped inner surface, and a light receiving device disposed on the upper substrate in a vicinity of the through-hole.

13. The structure of claim 12, wherein the light receiving device is buried in the upper substrate.

14. The structure of claim 12, wherein the reflection unit comprises an aluminum mirror.

15. The structure of claim 1, wherein the upper substrate is a semiconductor substrate that is sawed at a predetermined angle.

* * * * *